United States Patent
Azuma

(10) Patent No.: US 7,187,031 B2
(45) Date of Patent: Mar. 6, 2007

(54) SEMICONDUCTOR DEVICE HAVING A LOW DIELECTRIC CONSTANT FILM AND MANUFACTURING METHOD THEREOF

(75) Inventor: Kenichi Azuma, Hiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 61 days.

(21) Appl. No.: 10/157,908

(22) Filed: May 31, 2002

(65) Prior Publication Data

US 2003/0222319 A1    Dec. 4, 2003

(51) Int. Cl.
*H01L 29/76*    (2006.01)
*H01L 21/336*    (2006.01)

(52) U.S. Cl. .................. 257/327; 257/900; 438/300
(58) Field of Classification Search ............... 438/300; 257/327, 900
See application file for complete search history.

(56) References Cited

U.S. PATENT DOCUMENTS

| | | | |
|---|---|---|---|
| 6,121,671 A * | 9/2000 | Ko et al. ............... | 257/644 |
| 6,127,711 A * | 10/2000 | Ono ....................... | 257/410 |
| 6,307,230 B1 * | 10/2001 | Chatterjee et al. .......... | 257/327 |
| 6,372,589 B1 * | 4/2002 | Yu ............................. | 438/304 |
| 6,406,945 B1 * | 6/2002 | Lee et al. ................... | 438/142 |
| 6,458,661 B1 * | 10/2002 | Sung ......................... | 438/275 |
| 6,518,631 B1 * | 2/2003 | En et al. .................... | 257/382 |
| 2003/0038305 A1 * | 2/2003 | Wasshuber ................. | 257/213 |

FOREIGN PATENT DOCUMENTS

JP    7-22338 A    1/1995

OTHER PUBLICATIONS

Size, S.M., Physics of Semiconductor devices, 2$^{nd}$ Ed., p. 852.
J.M. Sung et al.; Flourine Effect on Boron Diffusion of P+ Gate Devices; 17.2.1 - 12.2.4.

* cited by examiner

*Primary Examiner*—Long Pham
*Assistant Examiner*—Shrininvas H. Rao
(74) *Attorney, Agent, or Firm*—Birch, Stewart, Kolasch & Birch, LLP

(57) ABSTRACT

A semiconductor device has a structure that reduces the parasitic capacitance by using a film with a low relative dielectric constant as the side wall material of the gate. The material with a low relative dielectric constant is preferably a material whose relative dielectric constant is less than the relative dielectric constant of an oxide film, i.e., less than about 3.9.

16 Claims, 10 Drawing Sheets

SEMICONDUCTOR DEVICE HAVING A LOW DIELECTRIC CONSTANT FILM AND MANUFACTURING METHOD THEREOF

FIELD OF THE INVENTION

The invention relates to a semiconductor device having a relatively low dielectric constant film and a manufacturing method for a semiconductor device having a relatively low dielectric constant film.

BACKGROUND OF THE INVENTION

With the increasing miniaturization of semiconductor elements in recent years, a demand has risen for technologies to achieve the following: reduction of the gate length of the transistor, reduction of the thickness of the gate oxide film, reduction of the film thickness of the electrode side wall spacer, and shallowing of junctions. However, it has also been desirable for basic device properties such as diffusion resistance, electrode resistance, and parasitic capacitance to be reduced or held at the level of the current generation.

Regarding processes currently under development, 0.13-μm processes require diffusion layers of depths from 45 to 90 nm and 0.1 μm processes require diffusion layers of depths from 35 to 70 nm. Meanwhile, the resistance required for the diffusion layer and gate wiring is 4 to 6 Ω. Currently, the most widely used silicide in 0.13-μm processes is $CoSi_2$ and the specific resistance is from 18 to 28 μΩ-cm.

Consequently, a $CoSi_2$ film thickness of approximately 36 nm is required to obtain a sheet resistance of 5 Ω, and the corresponding reaction quantity of Si is 130 nm. Even if Ni, having a resistance of 12 to 15 μΩ-cm, which is a lower specific resistance than Co, is used, 24 nm of Ni silicide is required, and thus 44 nm of Si is required for the reaction (IEDM 84 P110)

As a result, the distance between the junction surface of the diffusion layer and the bottom surface of the silicide layer decreases and leads to degradation of the junction properties (increased junction leakage current). The distance between the junction and the bottom surface of the silicide maintains the junction properties, and based on experience it is generally determined that a distance of approximately 50 nm is required. On the other hand, it is desirable to make the diffusion layer shallower in order to miniaturize the transistor. Thus, the objectives of maintaining the silicide resistance value and developing a more miniature transistor have a reached an impasse where they contradict each other.

One means of solving this problem was to use stacked diffusion layer technology as discussed in Laid-Open Japanese Patent Publication No. 7-22338. Using such technology, Si is stacked onto a diffusion layer region, high-concentration ion implantation is conducted, and then a silicide is formed. This conventional art manufacturing method will be further described with regard to FIGS. 16–19.

FIG. 16 depicts the formation of an isolation region 102 on a silicon substrate 101. Impurities are implanted into the substrate 101 as necessary. Gate oxide film 103 and gate electrode 104 are deposited, and patterning is conducted. Next, as shown in FIG. 17, a drain extension region 106 is formed by conducting drain extension, pocket implantation, etc. Then a side wall spacer 105 is formed by depositing an insulating film on the entire surface and conducting an anisotropic etch. Next, as shown in FIG. 18, a silicon film 107 is epitaxially grown on silicon substrate 101 using an epitaxial method such as the load-lock type silicon CVD device described in Laid-Open Japanese Patent Publication No. 7-22338. Thereafter, ion implantation is conducted to form a high-concentration region.

In conventional processes having no epitaxial region, it was necessary to conduct extremely shallow implantation in order to improve the transistor characteristics. However, when there is an epitaxially grown region on the silicon substrate as shown in FIG. 18, a higher implantation energy could be used and a heat treatment with sufficient activation could be conducted. In short, as shown in FIG. 19, a sufficiently deep junction 108 could be made and the transistor characteristics could be improved.

However, these stacked diffusion layer technologies, like those presented in Laid-Open Japanese Patent Publication No. 7-22338, increase the parasitic capacitance between the gate electrode and the diffusion layer, and have an enormous effect on the speed of the circuit itself. Also, it is necessary to lower the resistance of the drain extension in order to raise the drive current of the transistor. As a result, it is necessary to make the side wall spacer of the gate electrode thinner, which causes the parasitic capacitance to increase even further.

The parasitic capacitance of the gate side wall can be calculated as indicated below. Assuming the width of the transistor channel is Wch, the width of the side wall is Wsw, the side wall material is $Si_3N_4$, and the height of the stacked diffusion layer is d, then the parasitic capacitance CSW generated in one transistor is given by $$CSW = \in 0 * \in SiN * d * Wch / Wsw.$$

Here, $\in 0$ is the relative dielectric constant in a vacuum ($8.85 \times 10^{-12}$ F/m) and $\in SiN$ is the relative dielectric constant (7.5) of the nitride film. It is clear that the parasitic capacitance increases when the width of the side wall is made thinner and when the stacked diffusion layer is made thicker.

The dielectric constant of $SiO_2$ is lower than that of $Si_3N_4$. $SiO_2$ has a dielectric constant of 3.9, but $Si_3N_4$ has a dielectric constant of 7.5. See S. M. Sze, Physics of Semiconductor Devices, 2nd Ed., page 852. Silicon oxynitrides have dielectric constants ranging between about 4 and 7. In contrast, other nitrides have higher dielectric constants, where GaN has a dielectric constant of about 8.9, AlN has a dielectric constant of about 8.5 and InN has a dielectric constant of about 15.3. Also, the dielectric constants of metal oxides can be considered, where $Al_2O_3$ has a dielectric constant of about 9, $Ta_2O_5$ has a dielectric constant of about 25, $ZrO_2$ has a dielectric constant of about 25, $HfO_2$ has a dielectric constant of about 40 and $TiO_2$ has a dielectric constant of about 50.

As has been noted, conventional technology for the manufacture of thin film transistors has disadvantages when applied to further miniaturization.

SUMMARY OF THE INVENTION

The invention, in part, pertains to a semiconductor device having a structure which reduces the parasitic capacitance by using a film with a low relative dielectric constant as the side wall material. The material with a low relative dielectric constant is preferably a material whose relative dielectric constant is less than the relative dielectric constant of an oxide film (i.e., less than about 3.9). In this case the parasitic capacitance of the device is lower than that of a $SiO_2$ sidewall device.

The invention, in part, pertains to a semiconductor device having a structure that reduces the parasitic capacitance by using multi-layer side wall of a material including at least one of a low relative dielectric constant film or an oxynitride film. In this case, the parasitic capacitance of the device is lower than that of a SiN sidewall device.

The invetnion, in part, pertains to a semiconductor device having a structure that reduces the parasitic capacitance by using multi-layer side wall of a material including at least one of a low relative dielectric constant dilm or an oxynitrided film. In this case, the parasitic capacitance of the device is lower than that of a SiN sidewall devce.

The invention, in part, pertains to a semiconductor device that is a field effect transistor with at least one side wall spacer, the side wall spacer including a film with dielectric constant relatively lower than that of an oxide film, or an oxynitrided film. The field effect rransistor can be formed on the semiconductor substrate using a stacked diffusion layer.

The invention, in part, pertains to a semiconductor device that is a field effect transistor with at least one side wall spacer, the sidewall spacer including a film with dielectric constant relatively lower than that of an oxide film, or an oxynitrided film. Additionally, the field effect transistor includes a diffusion layer surface at a relatively higher position than a channel surface of the field effect transistor on a semiconductor substrate.

The invention, in part, also provides a method of forming a semiconductor device with a relatively low dielectric constant side wall film. In this method, a trench separation region, gate oxide film, and gate electrode are formed on a semiconductor substrate. Then, a film having a relatively low dielectric constant is deposited and the side wall spacer of the gate electrode is formed, preferably using anisotropic etching. The relatively low dielectric constant can be relative to the oxide film. Next, an Si film is epitaxially grown on the Si surface, high-concentration ion implantation is conducted, and an activation heat treatment is conducted to form a silicide. Afterwards, interlayer insulating films, contacts, and metal wirings are formed using existing technologies. Accordingly, with the present invention, the parasitic capacitance of the side faces of the gate electrode can be reduced in an element having a stacked diffusion layer structure.

DETAILED DESCRIPTION OF THE PREFERRED EMBODIMENTS

Advantages of the present invention will become more apparent from the detailed description given herein after. However, it should be understood that the detailed description and specific examples, while indicating preferred embodiments of the invention, are given by way of illustration only, since various changes and modifications within the spirit and scope of the invention will become apparent to those skilled in the art from this detailed description.

To reduce the size of a transistor, one must reduce the size of the gate to reduce the chip size. As the size of the gate becomes smaller, a field in a horizontal direction interferes with a field in the vertical direction. To reduce this interference, the diffusion layer must be made shallower. As the diffusion layer becomes shallower, the electric resistance becomes greater. This electric resistance needs to also be reduced. In order to accomplish this, a silicide technique has been developed. The electric resistance of the silicide is about one tenth of that of the diffusion layer. This permits the 0.13 μm line width of the current generation of semiconductor devices.

However, the silicide also needs some thickness to reduce resistance, and the diffusion layer must be thin. When the bottom of the diffusion layer and the silicide layer become close, current tends to leak. In order to avoid this current leakage, a structure having two diffusion layers has been developed: one layer being shallow and the other layer being deep. First, the shallow layer is formed, and silicon is grown over it using epitaxial growth. Then the high density region is provided. Thus, the resistance, as a whole, is reduced as if only a shallow connection is made. Since there is plenty of silicon on top, a thick silicide layer can be formed to reduce resistance. This is called the "raised source drain formation."

In a polysilicon gate terminal, a dielectric film is provided as an insulator, and parasitic capacitance results. The parasitic capacitance reduces the circuit operation speed. Therefore, the capacitance needs to be reduced. Conventionally, an $SiO_2$ film or $Si_3N_4$ film was used. $SiO_2$ has a dielectric constant of 3.9, but $Si_3N_4$ has a dielectric constant of 7.5. Therefore, if $Si_3N_4$ is used, the capacitance increases. This needs to be reduced, and conventionally $SiO_2$ is used. In the invention, a dopant is used to reduce the capacitance.

A method of forming a semiconductor isolation region in a field effect transistor that is a negative channel metal-oxide semiconductor (NMOS) is illustrated in FIGS. 1–5. This method and the resulting apparatus are merely exemplary and the present application is not so limited to what is described hereinafter.

Figure 1:
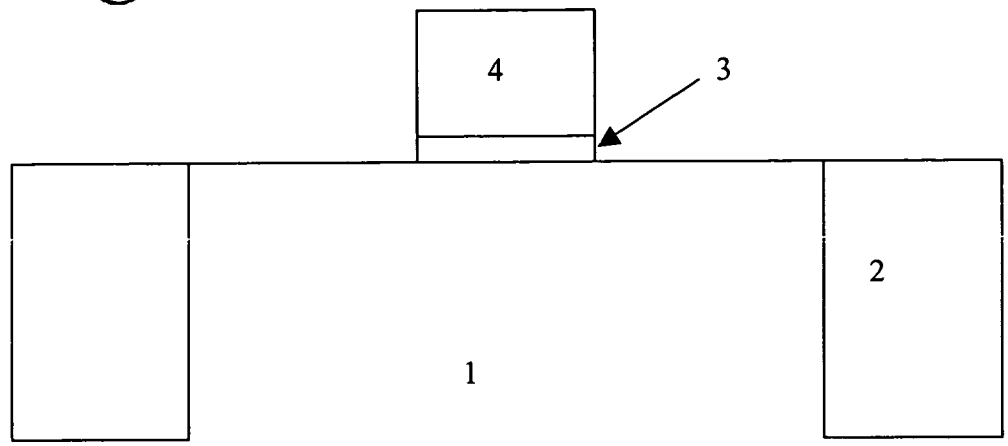
FIGS. 1–5 illustrate a semiconductor device and method of forming the device of a first embodiment of the present invention.

As shown in FIG. 1, an isolation region 2 is first formed on semiconductor surface 1. Next, ion implantation is required for adjusting a threshold voltage of the transistor and forming a well are introduced into the substrate using an existing implantation method to form the channel formation region of the transistor. Next a gate oxide film 3 (such as a thermal oxide film of 3 to 10 nm, or even more preferably about 5 nm) and a poly-Si film (using, for example, LP-CVD) of 100 to 400 nm, or even more preferably about 225 nm are deposited. A gate electrode 4 is formed on the gate oxide film 3 using conventional lithography and processing technologies. An antireflective film may also be deposited on the poly-Si film before electrode patterning in order to increase exposure precision.

Figure 2:
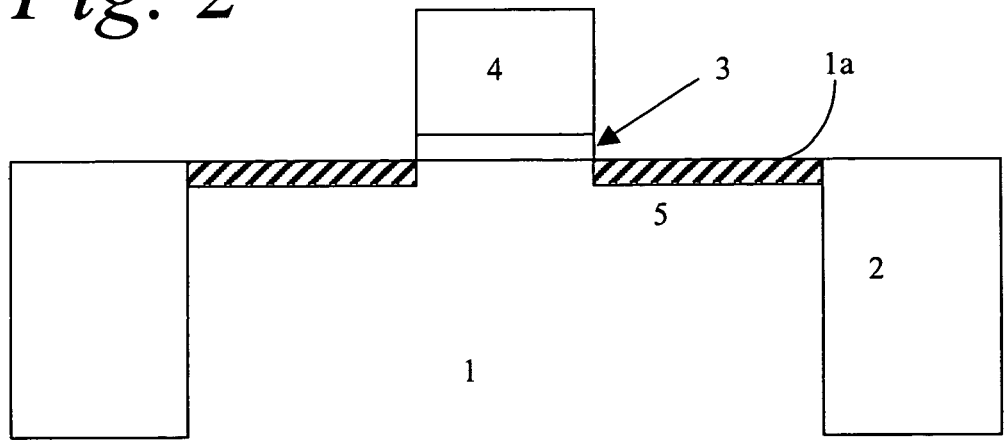

Next, as shown in FIG. 2, an oxide film 1a (formed, for example, by dry oxidization at about 700 to 800° C.) for ion implantation protection is formed, and drain extension and pocket implantation for improving the short channel characteristics are provided to form drain extension 5 of the transistor. Although these implantation conditions depend on the generation of the transistor, the following conditions are desirable for a drain extension in a 0.13-μm process: arsenic implantation at an energy of 1 to 10 key (preferably about 5 keV) and a dose of $1\times10^{14}$ to $1\times10^{15}/cm^2$ (preferably about $5\times10^{14}/cm^2$) and pocket implantation using an angled implantation at approximately 15 to 30 degrees and a dose of $2\times10^{13}$ to $1\times10^{14}/cm^2$ using step implantation.

Figure 3:
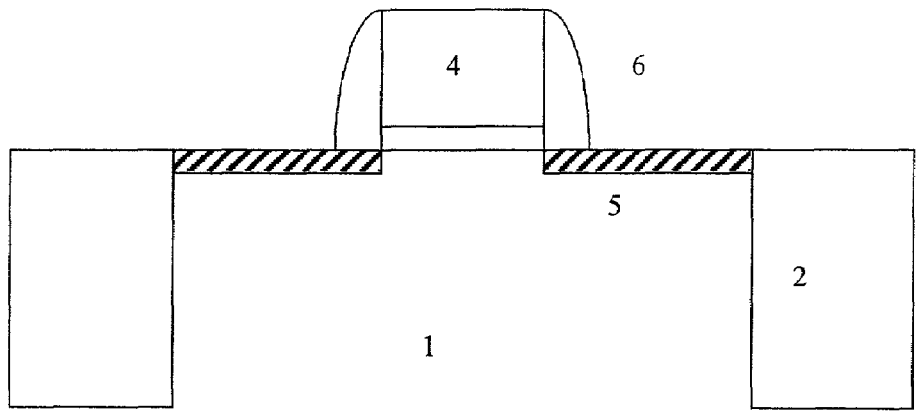

Next, a film having a low dielectric constant (preferably a film made of the fluorine-containing SiOF and having a relative dielectric constant of 3.5 to 3.6) is deposited to a thickness of about 50 to 150 nm (preferably about 100 nm) using, for example, a CVD method. A side wall spacer 6 is formed by etching back using, for example, anisotropic etching, as shown in FIG. 3. Reactive ion etch (RIE) is one method that can be used for anisotropic etching. It is also possible to deposit, for example, an oxide film and/or a nitride film as a buffer film before depositing the SiOF film.

The film having a low dielectric constant can have a dielectric constant relatively lower than that of an oxide film. This low dielectric constant film can include at least one of: an oxide film doped with fluorine, an oxide film doped with carbon, an oxynitrided film, an amorphous carbon film, an inorganic SOG film, an organic SOG film, Allied Signal's FLARE™ and HOSP™, Dow Chemical's SiLK™, Dow Corning's HSQ™, Catalysts and Chemicals' IPS™, and Applied Materials' BLACK DIAMOND™. Combinations of these materials can also be used to form the film with the relatively low dielectric constant. The film with the relatively low dielectric constant can be deposited using one of a CVD or a SOG method, without being restricted to these methods.

Figure 4:
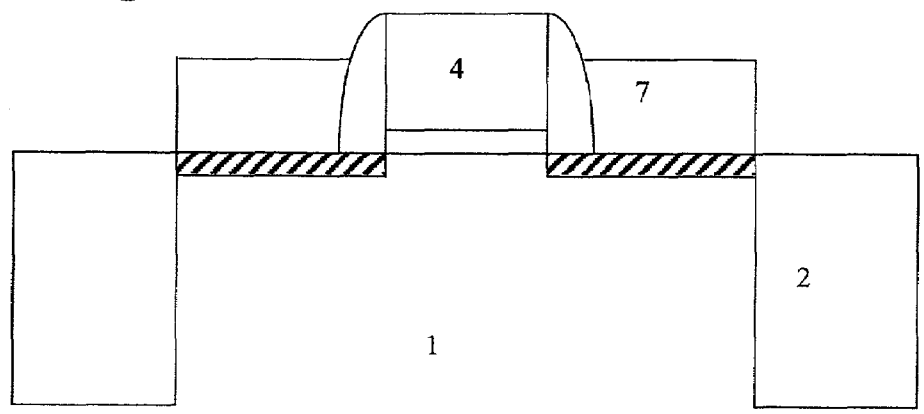

Next, all oxide films are removed from the Si surface and about 10 to 100 nm (preferably about 50 nm) of Si are epitaxially grown on the Si substrate using a load-lock type vertical furnace. It is also acceptable to use an existing epitaxial device to accomplish the epitaxial growth, such as by L/L Poly CVD. Non-crystalline Si is deposited on the gate electrode and the element separation isolation region, but it is removed selectively using a liquid mixture of hydrofluoric acid, acetic acid, nitric acid, or the like as shown in FIG. 4.

Figure 5:
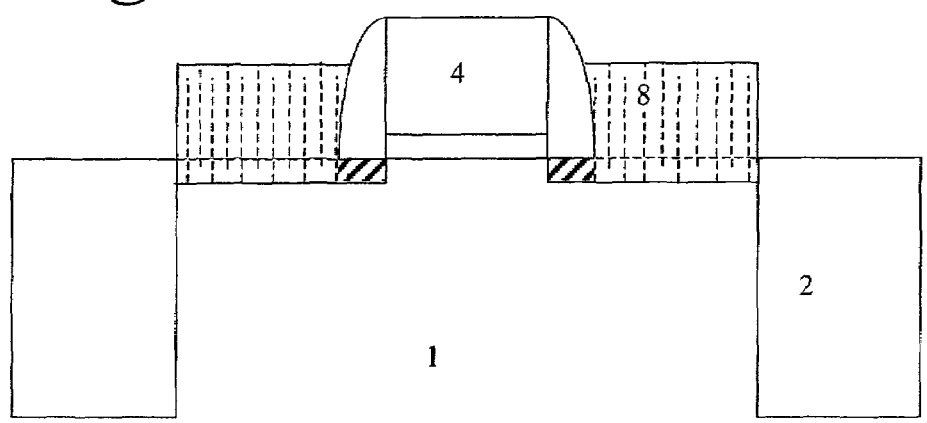

Next, high-concentration ion implantation (using, for example, arsenic at 30 to 200 keV and a dose of about $2\times10^{15}$ to $1\times10^{16}/cm^2$ for example, even more preferably about 120 keV and about $5\times10^{15}/cm^2$) for forming the source and drain is performed. Then, an activation heat treatment at about 900° C. to about 1100° C. is conducted for approximately 5 to 30 seconds (preferably about 10 seconds at about 1000° C.) to form source-drain region 8 as shown in FIG. 5. Finally, a semiconductor element with a small parasitic capacitance is completed by forming a silicide, depositing interlayer films, forming contacts, and patterning wiring using conventional technologies.

Although this embodiment of the present application presents the fabrication of an NMOS, the invention can also be applied to other semiconductors and field effect transistors, including but not limited to, positive channel metal oxide semiconductor (PMOS), complementary metal oxide semiconductor (CMOS), and silicon on insulator (SOI).

A second alternative method of forming a semiconductor element separation region in a semiconductor device (a negative channel metal-oxide semiconductor (NMOS) is illustrated in FIGS. 1–5, but this is merely exemplary and the present application is not so limited) in accordance with the invention is described hereinafter.

Figure 6:
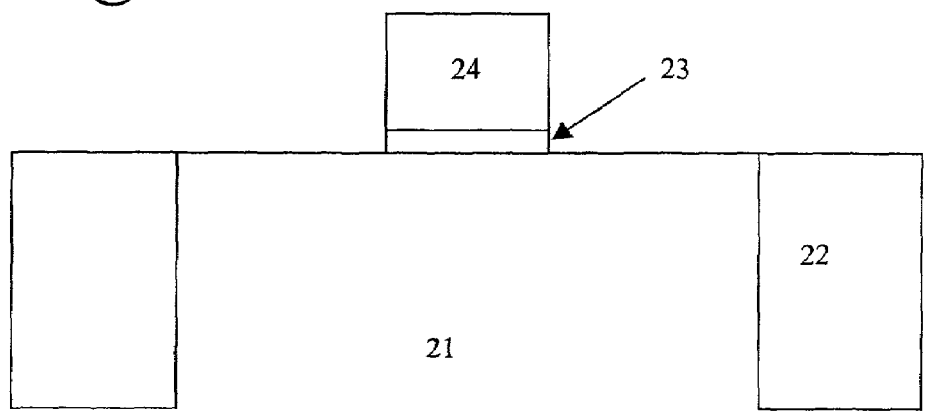
FIGS. 6–10 illustrate a semiconductor device and method of forming the device of a second embodiment of the present invention.

As shown in FIG. 6, an element separation region 22 is first formed on semiconductor surface 21. Next, ions required for adjusting a threshold value of the transistor and forming a well are introduced into the substrate using a conventional implantation method to form the channel formation region of the transistor. Next, a gate oxide film 23 (such as a thermal oxide film of about 1 to 10 nm, or even more preferably about 2 nm) and a poly-Si film (using, for example, LP-CVD) of about 100 to 400 nm, or even more preferably about 225 nm are deposited. A gate electrode 24 is formed on the gate oxide film 23 using conventional lithography and processing technologies. An antireflective film may also be deposited on the poly-Si film before electrode patterning in order to increase exposure precision.

Figure 7:
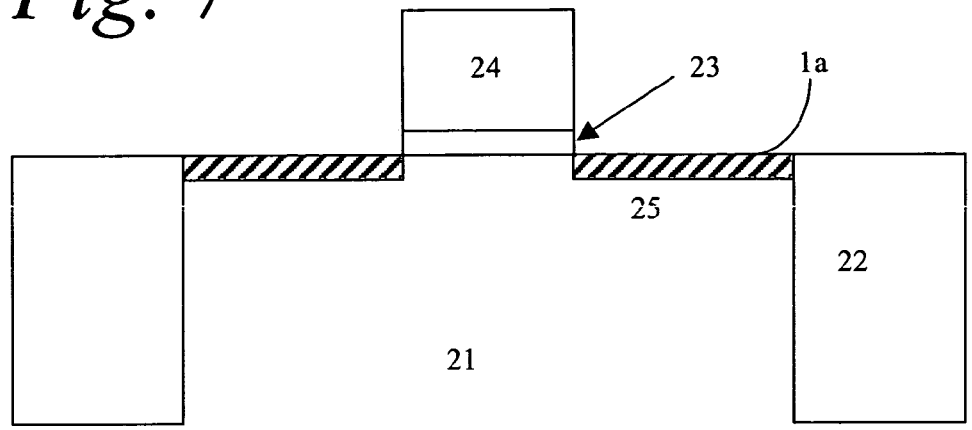

Next, as shown in FIG. 7, an oxide film 1a (formed for example by dry oxidization at about 700 to 800° C.) for ion implantation protection is formed. Then, drain extension and pocket implantation for improving the short channel characteristics are conducted to form drain extension 25 of the transistor. Although these implantation conditions depend on the generation of the transistor, the following conditions are desirable for an extension in a 0.13-micron process: arsenic implantation at energy of about 1 to 10 keV (preferably about 5 keV) and a dose of $1\times10^{14}$ to $1\times10^{15}/cm^2$ (preferably about $5\times10^{14}/cm^2$) and pocket implantation using an angled implantation at approximately 15 to 30 degrees and a dose of about $2\times10^{13}$ to $1\times10^{14}/cm^2$ using step implantation such as 4-direction or 8-direction step implantation (preferably a 20-degree angle implantation and total implantation dose of about $4\times10^{13}/cm^2$ are accomplished by conducting step implantation four times).

Figure 8:
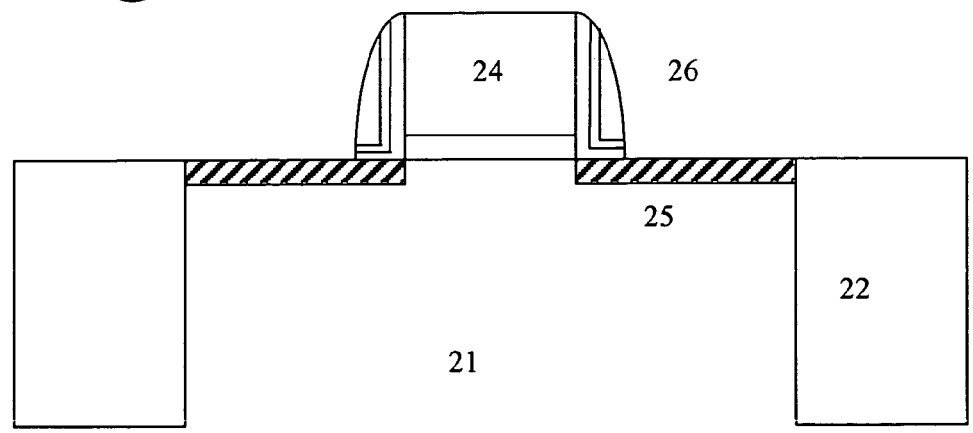
Figure 8A:
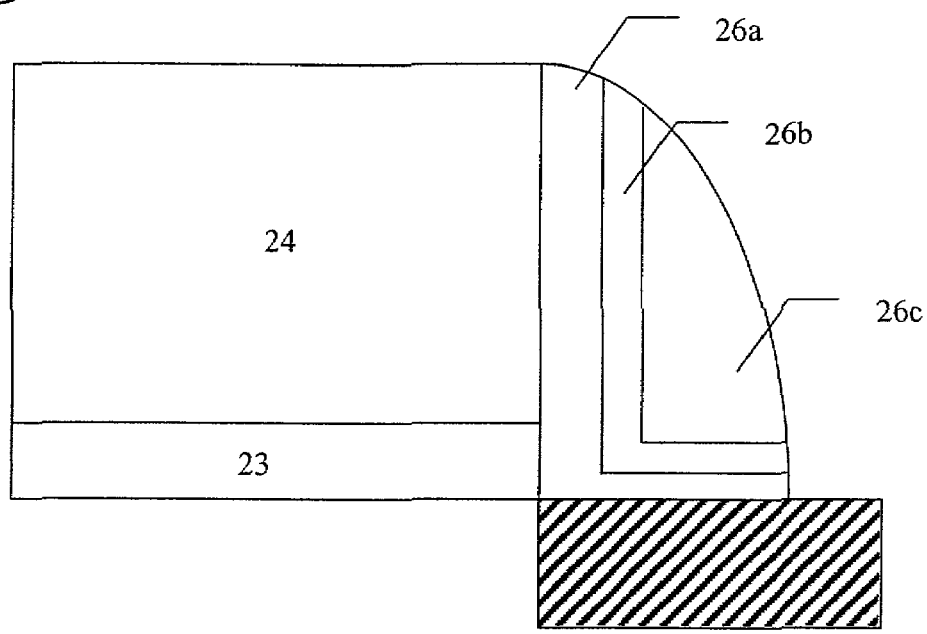

Next, an oxide film having a thickness of about 5 to 20 nm (preferably about 10 nm), a nitride film having a thickness of about 5 to 50 nm (preferably about 20 nm), and a film having a low dielectric constant (preferably a film made of the fluorine-containing oxide SiOF and having a relative dielectric constant of 3.5 to 3.6) are deposited to a thickness of about 800 nm and side wall spacer 26 is formed by etching back using, for example, anisotropic etching, as shown in FIG. 8. An anisotropic etch technique such as reactive ion etch (RIE) can be used. FIG. 8a shows a detail of the side wall spacer 26 indicating the oxide film 26a, the nitride film 26b and the film having the relatively low dielectric constant 26c.

Figure 9:
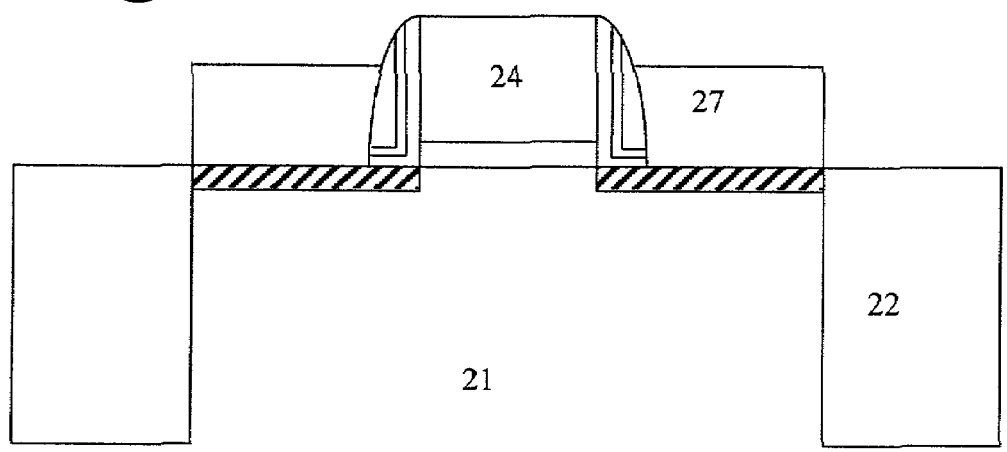

Next, all oxide films are removed from the Si surface and about 50 nm of Si 27 are epitaxially grown on the Si substrate using a load-lock type vertical furnace. It is also acceptable to use an existing epitaxial device to accomplish the epitaxial growth. Non-crystalline Si is deposited on the gate electrode and the element separation region, but it is removed selectively using a liquid mixture of hydrofluoric acid, acetic acid, nitric acid, or the like as shown in FIG. 9.

Figure 10:
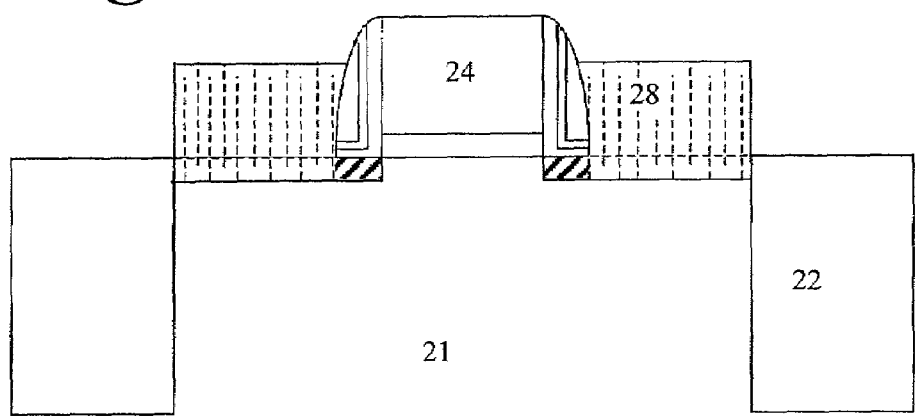

Next, high-concentration implantation (using, for example, arsenic at about 30 to 200 keV and a dose of about $2\times10^{15}$ to $1\times10^{16}/cm^2$ for example, even more preferably about 120 keV and about $5\times10^{15}/cm^2$) for forming the source and drain is conducted and an activation heat treatment at about 900° C. to 1100° C. is conducted for approximately 5 to 30 seconds (preferably about 10 seconds at about 1000° C.) to form source-drain region 28 as shown in FIG. 10.

Finally, a semiconductor element with a small parasitic capacitance is completed by forming a silicide, depositing interlayer films, forming contacts, and patterning wiring using conventional technologies.

Although this embodiment of the present application presents the fabrication of an NMOS, the invention can also be applied to other semiconductors and field effect transistors, including but not limited to, positive channel metal oxide semiconductor (PMOS), complementary metal oxide semiconductor (CMOS), and silicon on insulator (SOI).

A third alternative method of forming a semiconductor element separation region in a semiconductor device in a semiconductor device (a negative channel metal-oxide semiconductor (NMOS) is illustrated in FIGS. 1–5, but this is merely exemplary and the present application is not so limited) in accordance with the present invention is described hereinafter.

Figure 11:
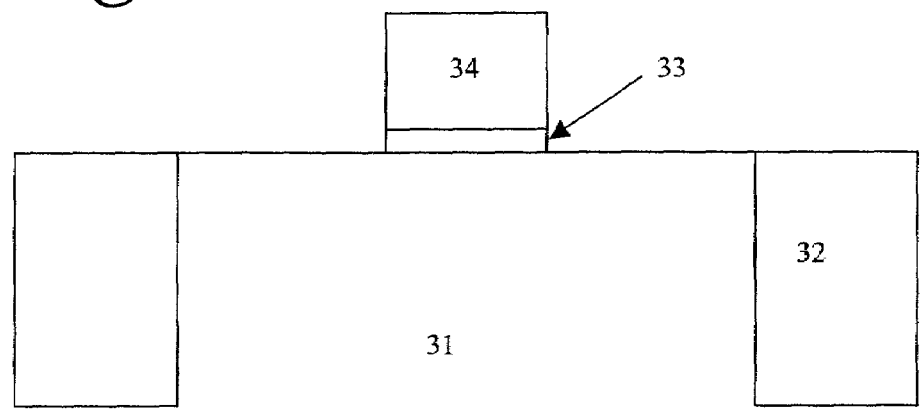
FIGS. 11–15 illustrate a semiconductor device and method of forming the device of a third embodiment of the present invention.

As shown in FIG. 11, an element separation region 32 is first formed on semiconductor surface 31. Next, ions required for adjusting a threshold value of the transistor and forming a well are introduced into the substrate using a conventional implantation method to form the channel formation region of the transistor. Next, a gate oxide film 33 (such as a thermal oxide film of about 3 to 10 nm, or even more preferably about 5 nm) and a poly-Si film (such as LP-CVD 100 to 400 nm, or even more preferably about 25 nm) are deposited and a gate electrode 34 is formed on the gate oxide film 33 using conventional lithography and processing technologies. An antireflective film may also be deposited on the poly-Si film before electrode patterning in order to increase exposure precision.

Figure 12:
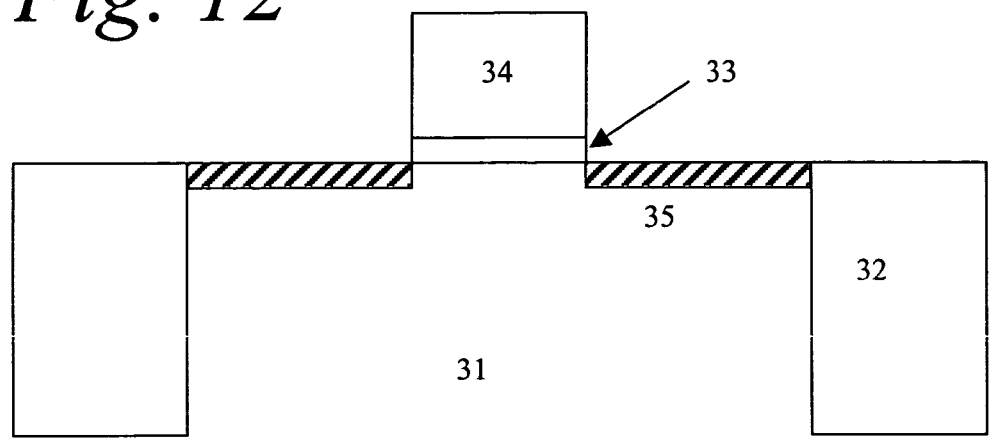

Next, as shown in FIG. 12, an oxide film 1a (formed for example by dry oxidization at 700 to 800° C.) for ion implantation protection is formed. Then, drain extension and pocket implantation for improving the short channel characteristics are conducted to form a drain extension 35. Although these implantation conditions depend on the generation of the transistor, the following conditions are desirable for a drain extension in a 0.13-micron process: arsenic implantation at energy of about 1 to 10 keV (preferably about 5 keV) and a dose of about $1 \times 10^{14}$ to $1 \times 10^{15}/cm^2$ (preferably about $5 \times 10^{14}/cm^2$) and pocket implantation using an angled implantation at approximately 15 to 30 degrees and a dose of $2 \times 10^{13}$ to $1 \times 10^{14}/cm^2$ using step implantation such as 4-direction or 8-direction step implantation (preferably a 20-degree angle implantation and total implantation dose of $4 \times 10^{13}/cm^2$ are accomplished by conducting step implantation four times).

Figure 13:
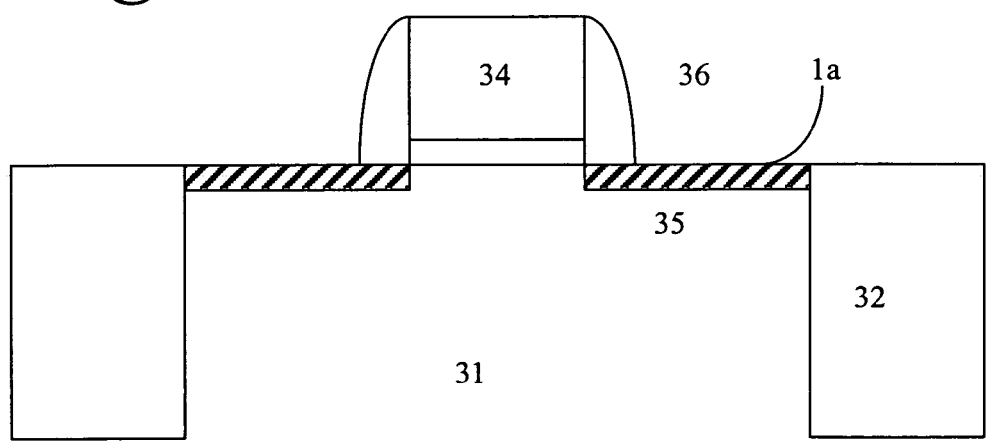

Next, a film having a relatively low dielectric constant (a film made of the oxynitride SiON and having a relative dielectric constant of about 3.9 to about 7.5) is deposited at a thickness of about 50 to 150 nm (preferably about 100 nm) using a CVD method and side wall spacer 36 is formed by etching back using, for example, anisotropic etching, as shown in FIG. 13. It is also acceptable to deposit an oxide film as a buffer film before depositing the SiON film.

Figure 14:
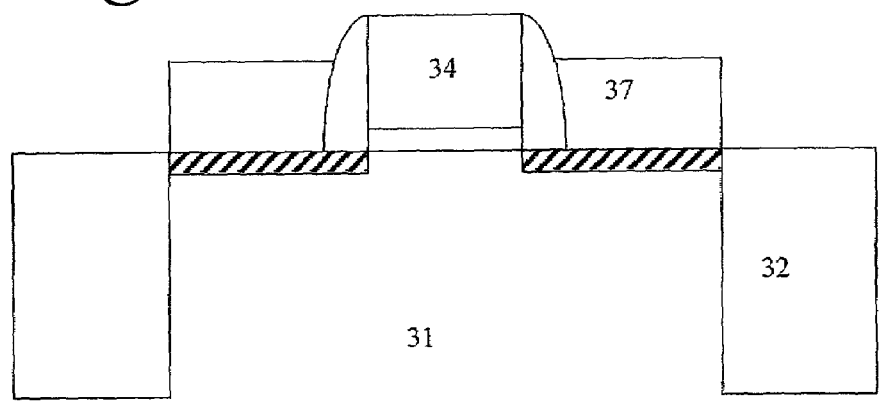

Next, all oxide films are removed from the Si surface and about 10 to 100 nm (preferably about 50 nm) of Si 37 are epitaxially grown on the Si substrate using a load-lock type vertical furnace, as is shown in FIG. 14. It is also acceptable to use a conventional epitaxial device to accomplish the epitaxial growth.

Figure 15:
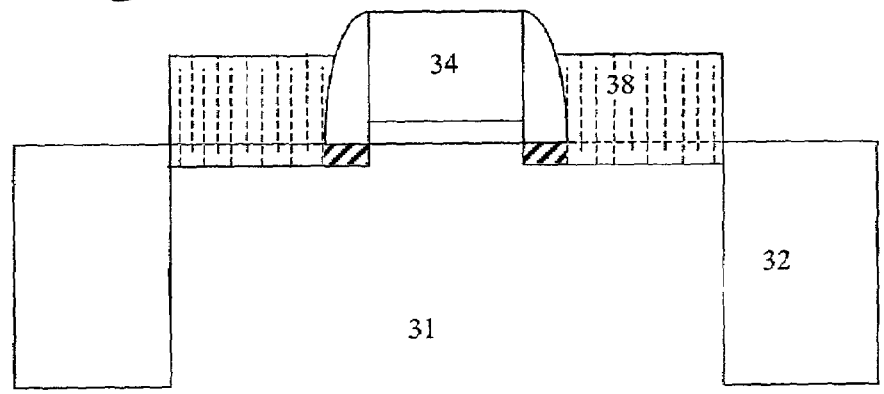
Figure 16:
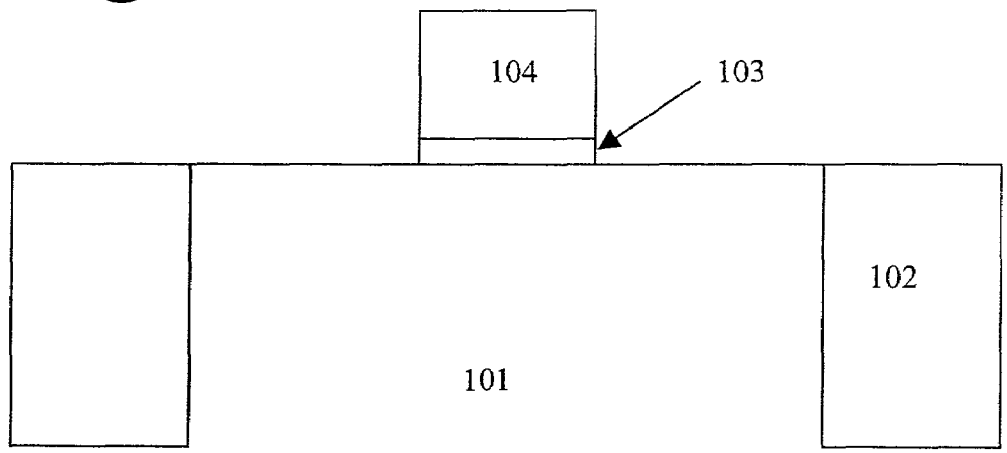
FIGS. 16–19 illustrate a conventional semiconductor and manufacturing method.
Figure 17:
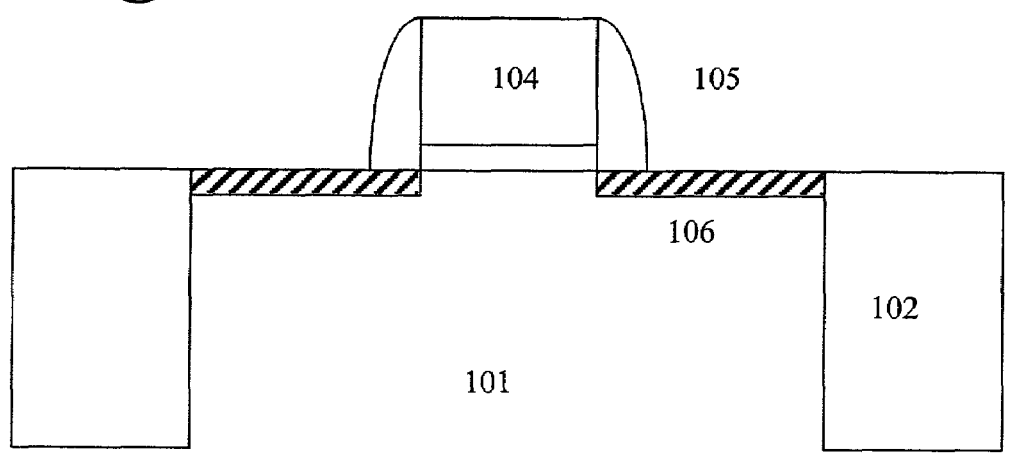
Figure 18:
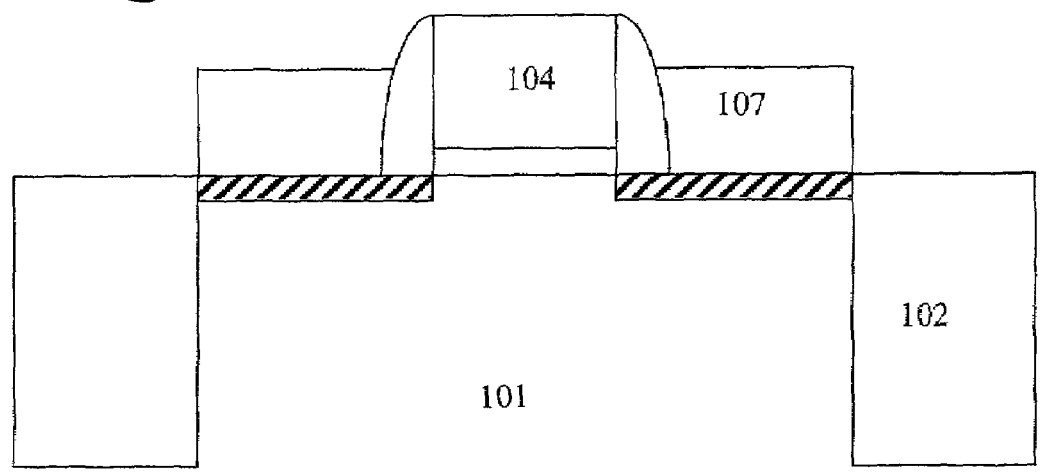
Figure 19:
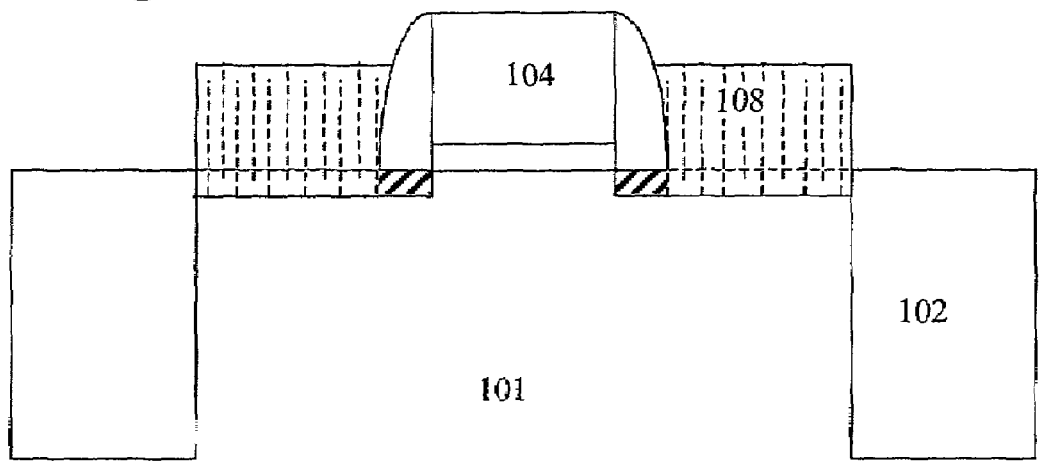

As shown in FIG. 15, non-crystalline Si is deposited on the gate electrode and the element separation region, but it is removed selectively using a liquid mixture of fluoric acid, acetic acid, etc. Next, high-concentration implantation (using for example, arsenic at 30 to 200 keV from about $2 \times 10^{15}$ to $1 \times 10^{16}/cm^2$ for example, even more preferably about 120 keV and about $5 \times 10^{15}/cm^2$) for forming the source and drain is conducted and an activation heat treatment at about 900° C. to 1100° C. is conducted for approximately 5 to 30 seconds (preferably about 10 seconds at 1000° C.) to form source-drain region 38 as shown in FIG. 15.

Finally, a semiconductor element with a small parasitic capacitance is completed by forming a silicide, depositing interlayer films, forming contacts, and patterning wirings using existing technologies.

Although this embodiment of the present application presents the fabrication of an NMOS, the invention can also be applied to other semiconductors, including but not limited to, positive channel metal oxide semiconductor (PMOS), complementary metal oxide semiconductor (CMOS), and silicon on insulator (SOI).

Although this embodiment of the present application presents the fabrication of an NMOS, the invention can also be applied to other semiconductors, including but not limited to positive channel metal oxide semiconductor (PMOS), complementary metal oxide semiconductor (CMOS), and silicon on insulator (SOI).

The present invention makes it possible to, among other features, reduce the parasitic resistance between the electrodes and diffusion layer of a semiconductor element having a stacked diffusion layer structure.

The invention being thus described, it will be obvious that the same may be varied in many ways. Such variations are not to be regarded as a departure from the spirit and scope of the invention, and all such modifications, as would be obvious to one skilled in the art, are intended to be included within the scope of the following claims.

I claim:

1. A semiconductor device comprising:
   a field effect transistor with at least one side wall spacer, wherein the at least one sidewall spacer does not extend over a top surface of a gate electrode of the field effect transistor, and the at least one sidewall spacer has at least three layers comprising an undoped oxide film, a nitride film and an oxide film which is doped so as to have a dielectric constant lower than that of the undoped oxide film, said films arranged in that order.

2. The semiconductor device of claim 1, wherein the field effect transistor includes a diffusion layer surface at a higher position than a channel surface of the field effect transistor on a semiconductor substrate.

3. The semiconductor device of claim 1, wherein the doped oxide film is selected from the group consisting of an oxide film doped with fluorine and an oxide film doped with carbon.

4. A method of manufacturing a semiconductor device, comprising:
   forming a gate electrode;
   forming a sidewall spacer of a the gate electrode of a transistor by forming, in order, an undoped oxide film, a nitride film, and a doped oxide film having a dielectric constant lower than that of the undoped oxide film, wherein the sidewall spacer does not extend over a top surface of the gate electrode, and
   forming the field effect transistor on a semiconductor substrate using a stacked diffusion layer.

5. The method of claim 4, wherein the doped oxide film is selected from the group consisting of an oxide film doped with fluorine and an oxide film doped with carbon.

6. The method of claim 4, comprising:
   depositing a film having a dielectric constant relatively lower than that of the oxide layer after the gate electrode is formed,
   etching the film having a dielectric constant lower than that of the oxide layer so as to remain only on the gate electrode side wall spacer,
   forming a stacked diffusion layer in a diffusion region of the transistor; and
   forming a high-concentration impurity region.

7. The method of claim 6, wherein the step of depositing is performed using a CVD method.

8. The method of claim 6, wherein the step of depositing is performed using silicon on a glass substrate.

9. The method of claim 6, wherein the step of etching is performed using anisotropic etching.

10. The method of claim 6, wherein the stacked diffusion layer is formed using an epitaxial method.

11. The semiconductor device of claim 1, wherein the oxide film which is doped comprises SiOF.

12. The semiconductor device of claim 2, wherein the oxide film which is doped comprises SiOF.

13. The semiconductor device of claim 3, wherein the doped oxide film comprises SiOF.

14. The method of claim 4, wherein the doped oxide film comprises SiOF.

15. The method of claim 5, wherein the doped oxide film comprises SiOF.

16. The method of claim 6, wherein the doped oxide film comprises SiOF.

* * * * *